United States Patent [19]

Hackleman et al.

[11] Patent Number: 4,664,746
[45] Date of Patent: May 12, 1987

[54] CREATING OR REMOVING A CONDUCTIVE LAYER ON AN INSULATOR OVER A SEMICONDUCTOR

[75] Inventors: David E. Hackleman, Monmouth; Ralph H. Nielsen, Jr.; Marzio A. Leban, both of Corvallis, all of Oreg.

[73] Assignee: Hewlett-Packard Company, Palo Alto, Calif.

[21] Appl. No.: 857,702

[22] Filed: Apr. 29, 1986

Related U.S. Application Data

[62] Division of Ser. No. 745,036, Jun. 13, 1985, Pat. No. 4,596,627, which is a division of Ser. No. 470,673, Feb. 28, 1983, Pat. No. 4,454,004.

[51] Int. Cl.[4] .................. B44C 1/22; C03C 15/00; C03C 25/06; H01L 21/306
[52] U.S. Cl. .................................. 156/628; 156/653; 156/657; 156/659.1

[58] Field of Search .............. 156/628, 643, 653, 657, 156/662; 148/1.5, 187, 191; 204/34.5, 35.1; 29/571; 427/399

[56] References Cited

U.S. PATENT DOCUMENTS 2,980,594  4/1961  Pankove .................. 156/657 X

Primary Examiner—William A. Powell
Attorney, Agent, or Firm—Jeffery B. Fromm

[57] ABSTRACT

A new phenomenon in integrated circuit etch processing is presented, explained and utilized to permit better removal of layers overlying integrated circuit structures, and if desired, the formation of conductive layers on such structures by a less complicated and lower temperature process than has been possible by conventional techniques.

2 Claims, 3 Drawing Figures

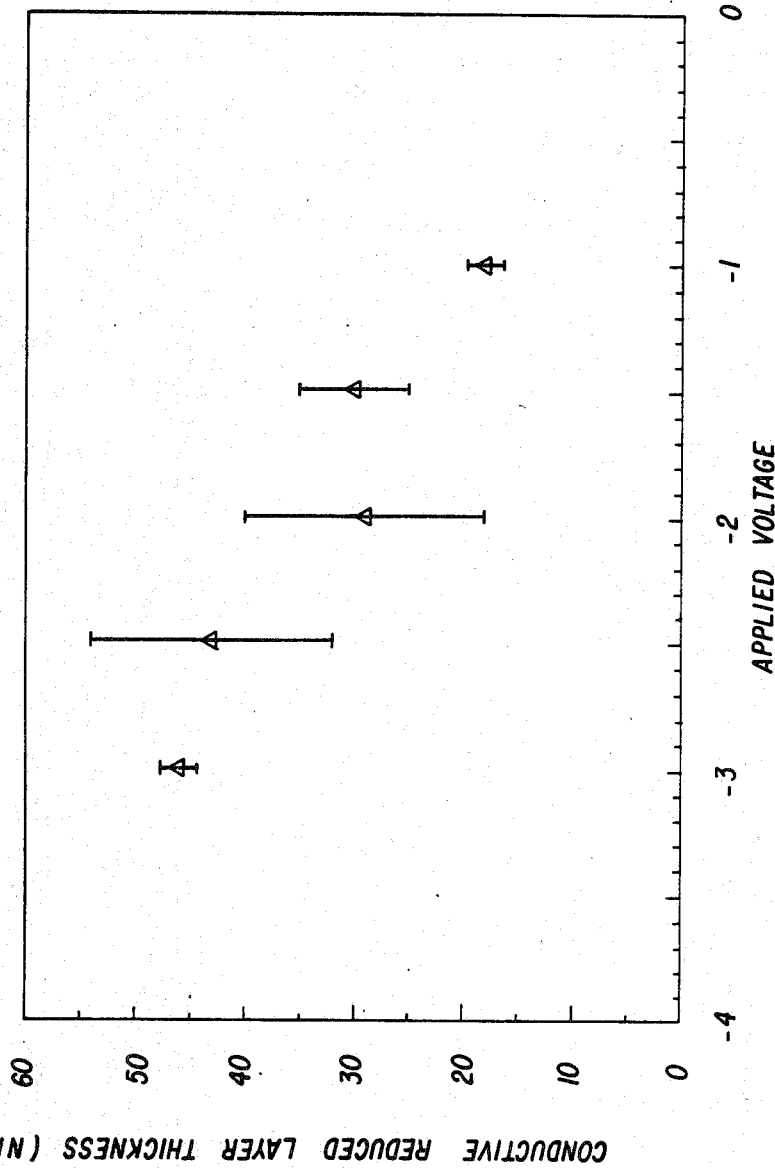

CREATING OR REMOVING A CONDUCTIVE LAYER ON AN INSULATOR OVER A SEMICONDUCTOR

This is a division of application Ser. No. 745,036, filed June 13, 1985, U.S. Pat. No. 4,596,627 which is a division of application Ser. No. 470,673, filed 2/28/83, U.S. Pat. No. 4,454,004.

BACKGROUND

The dissolution of silicon dioxide (SiO2) in a hydrofluoric acid (HF) solution is a fundamental step in the fabrication of integrated circuits (IC). The overall chemical reaction involved is usually understood as:

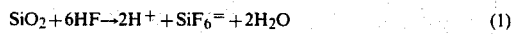

$$SiO_2 + 6HF \rightarrow 2H^+ + SiF_6^= + 2H_2O \qquad (1)$$

Etch rates and etch profiles are usually controlled by buffering and/or diluting the HF solution and by doping or altering the oxide layer via thermal diffusions or ion implantation. Based on conventional knowledge behind these techniques; etching of an IC structure such as that shown in FIG. 1 occurs isotropically, with only a modest decrease in the etch rate of the acceptor doped material 10 found over the p+ region 20 when compared to the donor doped material 30 found over the n+ region 40. A slight overetch on the p+ side 10 of the bore 50 through the photoresist 60 is sometimes necessary due to the added oxide thickness in region 30, but this is a minor difficulty, easily accomplished in order to clear both areas 10 and 30 of oxide.

SUMMARY OF THE INVENTION

Under some conditions when the structure in FIG. 1 is etched with hydrofluoric acid, the n+ side 40 cannot be cleared of overlying material regardless of the overetch time. The resulting overlying layer 100 as shown in FIG. 2 is insoluble in conventional HF solutions using conventional techniques, resulting in an inability to clear the surface 110 in hole 50.

The present invention discloses how this etch stopping effect may be either prevented or induced as desired in several ways. A first method is accomplished by the control of the illumination of the IC structures both before and during etching; a second method is accomplished by modifying the chemicals used in the etch fluid itself; and, a third method is accomplished by impressing an electric field between the surface 110 and the etching fluid.

When used to prevent the etch stopping effect according to the present invention, the result is an increase in the number of functional ICs manufactured per wafer 120, thereby increasing the efficiency of the manufacturing process. The elimination of the etch stopping effect when desired thus permits greater flexibility in etching to layers below layers 10 and 30 which are being etched.

The inverse of these same processes can also be used to promote the etch stopping effect. The advantage of these inverse processes is the formation of a conductive layer over an IC structure with fewer process steps and at lower temperature than has before been possible.

DESCRIPTION OF THE DRAWINGS

FIG. 3 is a graph of data according to one embodiment of the present invention.

DETAILED DESCRIPTION OF THE INVENTION

Figure 1:
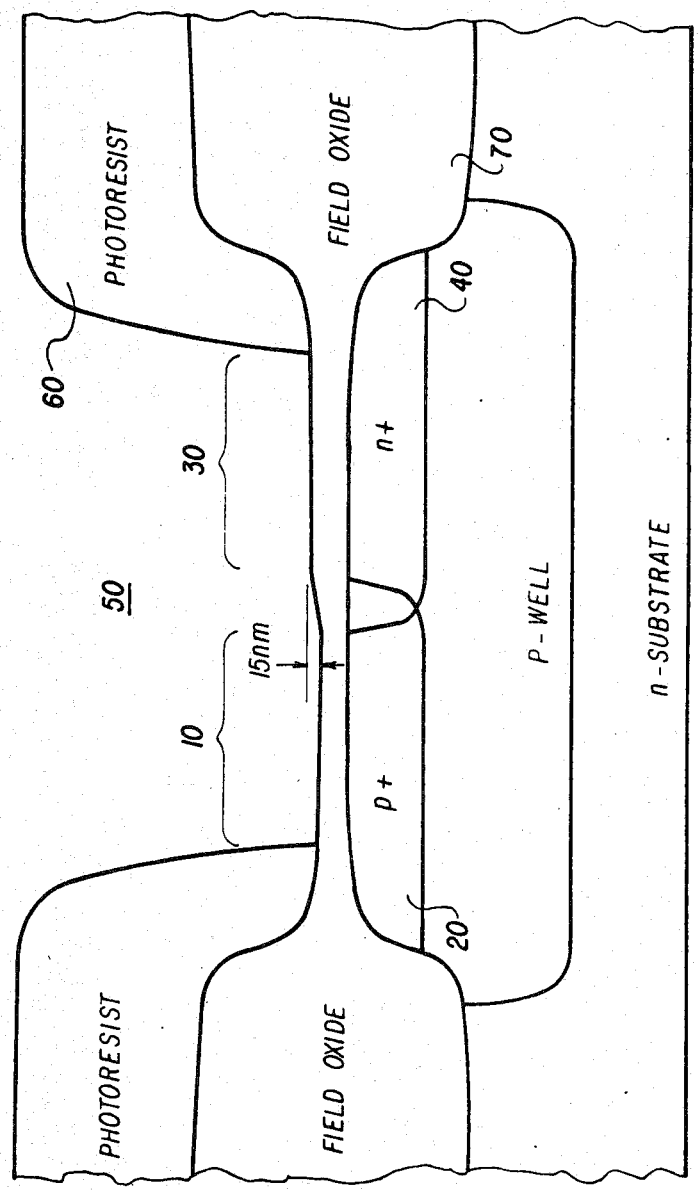
FIG. 1 shows the cross sectional view of an intermediate structure used in conventional integrated circuit manufacturing.
Figure 2:
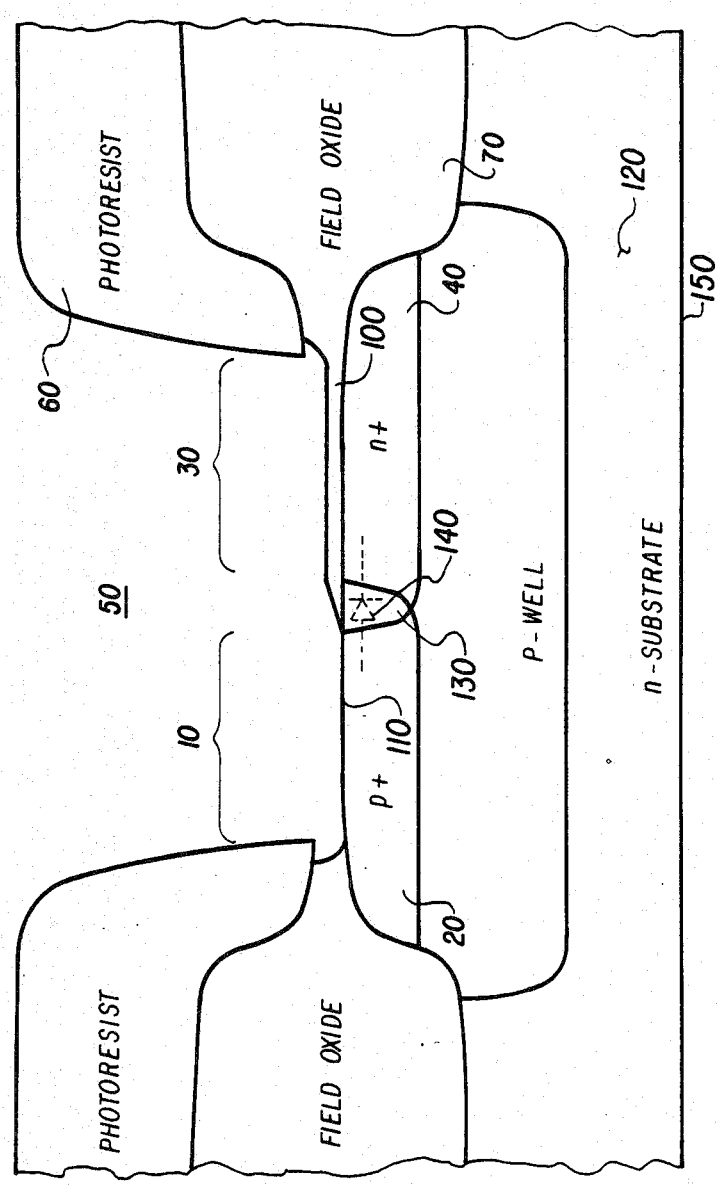
FIG. 2 shows the result of processing of the structure of FIG. 1 according to one embodiment of the present invention.

When areas 40 and 20 have high n+ and p+ doping concentrations respectively, the silicon surface 110 has very low defect densities, and the structure in FIG. 1 is etched in the yellow light present in most integrated circuit processing photomasking areas, it has been discovered that the n+ side oxide 30 will not clear as shown in FIG. 2 regardless of the amount of time the IC wafers 120 are left in the conventional HF etch bath as explained by Nielsen and Hackleman (two of the three of the present inventors) in *Some Illumination on the Mechanism of SiO2 Etching in HF Solutions*, Electrochemical Society Extended Abstracts, Oct. 17, 1982. This layer is insoluble in nonoxidizing HF solutions. It is believed that this HF-insoluble layer 100 shown in FIG. 2 formed from the oxide 70 is a thin layer of partially reduced SiO2 (i.e., SiO$_x$, where x<2). It is known that the layer 100 is electrically conductive and is sometimes brightly colored unlike normal silicon dioxide.

On the other hand, if the etch is performed in absolute darkness (i.e., less than one foot-candle of illumination) the oxide dissolves uniformly in both areas 10 and 30. This light sensitivity indicates possible photocharging of the p+-n+ junction 130 and the production of a local electric field across the oxide 70 above the p+ region 20 and the n+ region 40.

Despite the simplicity of equation (1), it is apparent that the mechanism for SiO2 dissolution in HF solutions is not known entirely. Bridging oxygen bonds are probably converted to silanol bonds which are than replaced by Si-F bonds, but the reactive species and mechanistic steps have not yet been isolated. The overall reaction given in Equation 1 does not require either reduction or oxidation of silicon. However, the creation of the insoluble layer 100 suggests that the normal dissolution process involves steps that at least approach reduction of the SiO2. The presence of an electric field then shifts the local chemical potential so that reduction is favored.

Environmental lighting experiments show that the HF etch stopping effect occurs when photons with wavelengths longer than that of blue visible light are present. Changing the junction structure to allow a larger depletion region (more efficient photon absorption) for example by increasing the p+-n+ overlap region 130 enhances the effect, reinforcing the belief that the p+ and n+ diffusions 20 and 40 form a photodiode 140 which becomes photocharged causing an electric field across the oxide 70 in areas 10 and 30.

Referring to FIG. 1, note that the n+ oxide 30 is thicker than the p+ oxide 10 by about 15 nm. If both oxides 10 and 30 etch at approximately the same rate, which is generally the case since the doping levels in the oxides are low enough that they do not affect the oxide etch rates, the p+ silicon 20 will be in direct contact with the etch solution while 15 nm of oxide 70 remains over the n+ silicon 40. If there is a photo-induced potential difference between the p+ and n+ diffusions 20 and 40, a similar potential will appear across the n+ oxide 30 when the p+ side 10 clears as shown in FIG. 2. Thus it is also possible that the electric field from the charged junction 130 may directly impede the etching the oxide 30 over the n+ silicon 40 before the p+ side 10 clears.

Additionally, when ICs are etched in ambient light which is usually maaintained at an intensity of 80–100 foot-candles, the oxide 10 and 30 over both the n+ and p+ silicon 40 and 20 is removed uniformly provided there is no diffusion overlap region 130. If there is any overlap 130 of the diffusions, the n+ oxide 30 will not be totally removed. However, when the same structures are etched in total darkness the oxide 10 and 30 is removed uniformly over both n+ and p+ silicon 40 and 20 regardless of the diffusion overlap 130.

Thus, the etch stopping phenomenon can be halted by controlling the environmental lighting conditions present during the etching process, the amount of light required depending on the quality of the diodes 140 produced. The relationship is $I=K*i$, where I is the required illumination intensity, K is a constant, and i is the leakage current of the diode 140. For complimentary MOS (CMOS) processes, a light level below one foot-candle is acceptable, but the darker the better. It is also necessary to darken the ICs prior to etching to allow enough time for photon-produced electrons to recombine into the IC structure and for equilibrium to be reached. In CMOS processes, this time is usually one minute or longer.

An alternative to completely darkening the ICs prior to and during the etching process is to use an optical filter to shade the ICs and eliminate undesirable photons during this time. The optical filter bandpass required to permit unimpeded etching should have a bandpass wavelength from 200–500 nanometers and an optimum filter bandpass wavelength of 200–400 nanometers.

In an IC structure with a P-N junction 130 as in FIG. 2 it is also possible to employ the inverse of the above described controlled illumination process in order to intentionally create a conductive reduced layer 100. By intentionally illuminating the IC structure with photons which will create a local electric field, it is possible to form a conductive layer 100 on the oxide insulating layer 70 while simultaneously etching the IC. In addition, since this is an adjunct to the etching process, it is done at or near room temperature without the need of specialized equipment. Hence, this new method of creating a conductive layer on an IC can be done with fewer process steps, less expensively, and at lower temperature than is possible with conventional techniques.

For IC structure with low photoelectron production efficiency (e.g., small overlap regions 130 of less than one micron), it is also possible to eliminate the etch stopping effect by altering the standard 1.5M HF etching solution. This is done by adding a weak oxidizing agent to the etching solution of strength sufficient to oxidize the reduced species as it is created, yet not attack the photoresist 60 which is usually an organic based polymeric resin with azides and acid groups. Oxalic acid, $(COOH)_2$, 10% by concentration added to the standard mixture of 1.5M HF in water has proven effective as one such weak oxidizing agent.

It is also possible to create the conductive reduced layer 100, by employing the inverse of the above described weak oxidizing agent process. This is done by the controlled addition of an appropriate reducing agent to the etching bath to create enough ions to permit generation of the conductive layer 100 from the silicon dioxide 70. Many weak bases can effectively be used for this process such as 10% by concentration trimethylamine, $(CH_3)_3N$. Since the ions needed for this process come from the etching bath, it is not necessary to have an underlying P-N overlap area 130 in order to create the conductive layer 100 as in the controlled illumination process.

An externally generated electric field across the oxide 70 in regions 10 and 30 is also capable of stopping the etch and creating a conductive reduced layer 100. This external electric field can be created by applying a voltage between the back 150 of the IC wafer 120 and the HF etch bath itself which in turn creates a negative potential with respect to the surface 110. As shown in FIG. 3, a potential difference of 0.5 v is sufficient for example to stop the etching of the silicon dioxide 70 at 10–15 nanometers, which is equivalent to a local electric field of approximately $0.4 \times 10^6$ volts/centimeter. Note that the actual voltage applied to the back 150 of the wafer 120 will depend on the nature of the doping between the back 150 and the surface 110. As long as the appropriate potential difference exists to create an electric field of 105 to 107 volts/centimeter across the oxide 70, no amount of HF overetch will clear the oxide region 30. Hence, it is only necessary that a voltage of between 0.01 and 1.0 volts per nanometer of desired thickness of conductive layer 100 be maintained while the IC is in the etch bath. The use of an external electric field also makes it unnecessary to have an underlying P-N overlap area 130 in order to create the desired conductive layer 100 as long as the conductive layer 100 is desired across the entire bottom of hole 50.

By reversing the externally applied voltage to reverse the externally generated electric field, the etch stopping process can also be prevented when a p-n overlap area 130 does exist. An external field across the oxide 70 in areas 10 and 30 in the range of $10^5$ to $10^7$ volts/centimeter is sufficient to prevent the creation of the conductive layer 100, even if no illumination control or etch bath chemical modification is used.

Finally, it is also possible to combine the above processes in varying degrees to accomplish various desired results. For example, by only partially darkening the wafers before and during etching, it is possible to use a lower concentration of the weak oxidizing agent such as oxalic acid to prevent the etch stopping effect.

We claim:

1. A method for creating a conductive reduced layer on an insulating layer over a surface of a semiconductor substrate with a fluid bath comprising:
    adding an electrolyte to the fluid bath;
    submerging the semiconductor substrate in the fluid bath with electrolyte;
    applying a negative voltage with respect to the surface of the semiconductor substrate and the fluid bath with electrolyte to create an electric field across the insulating layer, whereby at least a portion of the insulating layer is converted to a conductive reduced species.

2. A method as in claim 1 wherein the applied negative voltage comprises a voltage between 0.01 volts and 1.0 volts for each nanometer of thickness of the conductive reduced species desired.

* * * * *